(12) United States Patent
Briere

(10) Patent No.: US 10,269,903 B2
(45) Date of Patent: Apr. 23, 2019

(54) SEMICONDUCTOR STRUCTURE HAVING GRADED TRANSITION BODIES

(71) Applicant: Infineon Technologies Americas Corp., El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/826,576

(22) Filed: Nov. 29, 2017

(65) Prior Publication Data

US 2018/0083106 A1    Mar. 22, 2018

Related U.S. Application Data

(62) Division of application No. 14/619,942, filed on Feb. 11, 2015, now Pat. No. 9,837,495, which is a division
(Continued)

(51) Int. Cl.
*H01L 29/20* (2006.01)
*H01L 21/02* (2006.01)
(Continued)

(52) U.S. Cl.
CPC ...... *H01L 29/2003* (2013.01); *H01L 21/0237* (2013.01); *H01L 21/0251* (2013.01); *H01L 21/0254* (2013.01); *H01L 21/02381* (2013.01); *H01L 21/02458* (2013.01); *H01L 21/02488* (2013.01); *H01L 21/02505* (2013.01); *H01L 29/151* (2013.01); *H01L 29/205* (2013.01);
(Continued)

(58) Field of Classification Search
CPC ............... H01L 33/12; H01L 33/0075; H01L 21/02507; H01L 33/007; H01L 29/2003
See application file for complete search history.

(56) References Cited

U.S. PATENT DOCUMENTS

2002/0074552 A1\* 6/2002 Weeks, Jr. .............. C30B 23/02
257/76
2003/0132433 A1\* 7/2003 Piner ...................... C30B 23/02
257/19
(Continued)

FOREIGN PATENT DOCUMENTS

JP    2007221001 A    8/2007

*Primary Examiner* — Julia Slutsker
(74) *Attorney, Agent, or Firm* — Murphy, Bilak & Homiller, PLLC

(57) ABSTRACT

A semiconductor structure includes a substrate, a first graded transition body over the substrate, a second transition body and a III-Nitride semiconductor layer over the second transition body. The first graded transition body has a first lattice parameter at a first surface and a second lattice parameter at a second surface opposite the first surface. The second transition body has a smaller lattice parameter at a lower surface overlying the second surface of the first graded transition body and a larger lattice parameter at an upper surface of the second transition body. The second transition body includes at least two transition modules each having at least three interlayers. The first graded transition body and the second transition body reducing strain for the semiconductor structure.

17 Claims, 7 Drawing Sheets

Related U.S. Application Data of application No. 13/405,180, filed on Feb. 24, 2012, now Pat. No. 8,957,454.

(60) Provisional application No. 61/449,046, filed on Mar. 3, 2011.

(51) Int. Cl.
*H01L 29/778* (2006.01)
*H01L 29/15* (2006.01)
*H01L 29/205* (2006.01)

(52) U.S. Cl.
CPC ........ *H01L 29/778* (2013.01); *H01L 29/7786* (2013.01)

(56) References Cited

U.S. PATENT DOCUMENTS

| | | |
|---|---|---|
| 2005/0285141 A1 | 12/2005 | Piner et al. |
| 2009/0008647 A1 | 1/2009 | Li et al. |
| 2011/0001127 A1* | 1/2011 | Sakamoto ......... H01L 21/02381 257/22 |

* cited by examiner

SEMICONDUCTOR STRUCTURE HAVING GRADED TRANSITION BODIES

DEFINITION

As used herein, the phrase "III-Nitride material" or "III-Nitride" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride material also refers generally to any polarity including but not limited to Ga-polar, N-polar, semi-polar or non-polar crystal orientations. A III-Nitride material may also include either the Wurtzitic, Zincblende or mixed polytypes, and may include single-crystal, monocrystalline, polycrystalline, or amorphous structures.

BACKGROUND

III-Nitride materials are semiconductor compounds that have relatively wide direct bandgaps and can have strong piezoelectric polarizations, which can enable high breakdown fields, high saturation velocities, and the creation of two-dimensional electron gases (2DEGs). As a result, III-Nitride materials are used in many microelectronic applications as field-effect transistors (FETs), high electron mobility transistors (HEMTs), and diodes.

In many commercial applications, large area, low cost, and readily available substrates are needed for the deposition and crystal growth of III-Nitride materials, thin films, and resulting device structures. Consequently, many III-Nitride materials are grown on non-III-Nitride substrates, using one of several different thin film deposition techniques. However, III-Nitride materials have a different lattice constant/parameter than most commonly used non-III-Nitride substrate materials. In some cases, this lattice parameter difference, or lattice mismatch, can be relatively large, and can lead to the formation of crystal defects in the III-Nitride material layers that may impair the performance of devices formed using the III-Nitride material layers. While the III-Nitride materials are being epitaxially deposited, the lattice parameter mismatch of the III-Nitride structure interlayers can also build stress within the III-Nitride-substrate composite structure that may cause macroscopic deformation of the composite structure at growth temperatures. The stress and consequential deformation may tend to build as the thickness of the III-Nitrides layers increase and may reach deformation limits that, if exceeded, could result in excessive warp, bow and plastic deformation or slip of the composite structure. If this occurs during growth of the III-Nitride, the resulting deformation may result in physical separation of the composite structure from the growth platform. This can lead to mechanical instability of the composite structure within the deposition chambers as well as loss of uniform heating across the composite structure resulting in thickness and compositional non-uniformity for additional III-Nitride interlayer growth. The impact is a detrimental loss to fabricated device yields across the wafer and less than optimal designed device performance.

The inherent lattice parameter mismatches, associated strain on the composite structure, and consequential deformation during growth thus presents limitations to the thickness that can be achieved for the growth of III-Nitride materials in conventional structures. Such limitations may prevent the realization of III-Nitride device structures requiring relatively thick material stacks to achieve performance specifications such as those required by high voltage breakdown HEMTs, for example.

Additionally, differences in the material lattice thermal coefficients of expansion amongst and between the III-Nitride materials and the substrate can result in the development of significant stress during cool down front relatively high growth temperatures to room temperature that can also lead to large macroscopic deformation in terms of wafer warp and bow, epi structure cracking, as well as substrate plastic deformation and dislocation propagation (e.g. slip) of the resulting material-substrate structure. Such deformation can be large enough so as to make semiconductor device fabrication impracticable.

SUMMARY

The present disclosure is directed to III-Nitride semiconductor structures with strain absorbing interlayer transition modules, substantially as shown in and/or described in connection with at least one of the figures, and as set forth more completely in the claims.

DETAILED DESCRIPTION

Figure 1:
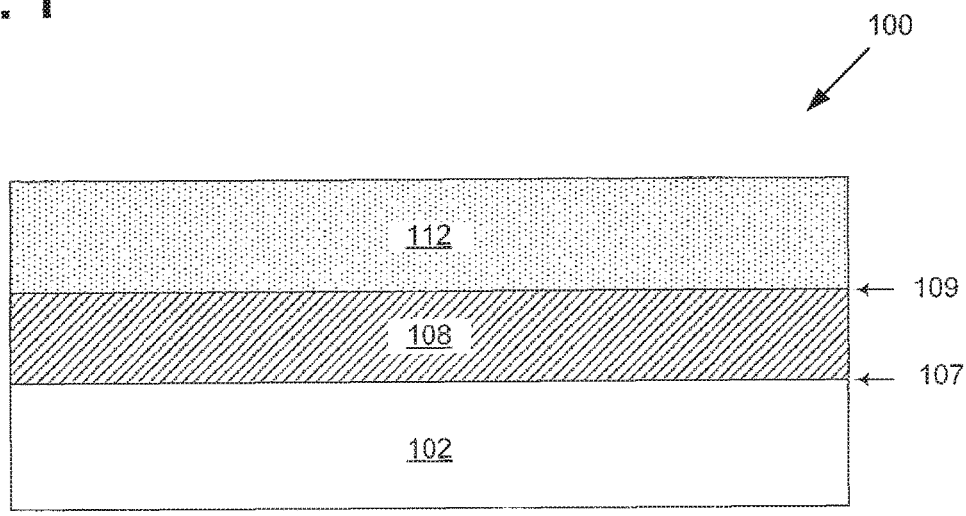
FIG. 1 shows a cross-sectional view of a conventional semiconductor structure.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

III-Nitride materials include, for example, gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap and can have strong piezoelectric polarizations enabling high breakdown fields, high saturation velocities, and the creation of two-dimensional electron gases (2DEGs). As a result, and as noted above, III-Nitride materials such as GaN are used in many microelectronic applications as field-effect transistors (FETs), high electron mobility transistors (HEMTs), and diodes.

As further noted above, in many of these applications, large area, low cost, and readily available substrates are needed for the deposition and crystal growth of III-Nitride materials, thin films, and resulting device structures. However, differences in the properties between III-Nitride materials and non-III-Nitride substrates can lead to difficulties in growing layers suitable for many applications.

For example, GaN has a different thermal expansion coefficient (e.g., thermal expansion rate) than many non-III-Nitride substrate materials such as silicon carbide, and silicon. This difference in thermal expansion can lead to large scale distortion of the shape of the composite structure (epitaxial layers, or "epi layers", and substrate) resulting in excessive warp, bow, and or cracking of III-Nitride layers deposited on such non-III-Nitride substrates, after completion of III-Nitride deposition and cooling of the structure from growth temperature down to room temperature, and thereby making further device fabrication impracticable. The cracking phenomena can prevent GaN materials from being suitable for use in many applications. Moreover, excessive warp and bow can prevent the subsequent standard processing of the wafers required or device fabrication, singulation and packaging (e.g., lithography, etch, metal deposition, dicing, and so forth).

In addition, III-Nitride materials are characterized by lattice parameters (also referred to as "lattice constants" in the art) that differ from those of commonly used non-III-Nitride substrate materials. In some cases, the lattice parameter differences can be relatively large (lattice parameter difference hereinafter referred to as "lattice mismatch"). Lattice mismatch typically leads to the formation of crystal defects in GaN or other III-Nitride material layers deposited on non-III-Nitride substrates. The presence of such defects can impair the performance of devices formed using the III-Nitride material layers. In extreme cases, the strain generated in the epi layers due to the lattice mismatch amongst and between the III-Nitride layers and substrate can cause macroscopic deformation during growth as well. This can occur during elevated temperatures required for epitaxy and is independent of the differences in thermal expansion coefficients. This also can lead to warp and bow of the composite structure, as welt as plastic deformation and defect propagation in the epi and or substrate, e.g., slip. Any macroscopic deformation of the composite structure during growth can lead to poor uniformity in thickness and composition of the resulting epi layers that may be detrimental to high yielding device fabrication and performance.

Some conventional techniques have been developed to address crack and defect formation as well as wafer bowing in III-Nitride materials deposited on non-III-nitride substrates through use of one or more buffer layers, and the use of transition layers prior to the deposition of the III-Nitride material on the underlying transition and buffer layers. An example of such a conventional technique is shown as semiconductor structure 100, in FIG. 1. According to conventional semiconductor structure 100, III-Nitride graded transition body 108 is formed over substrate 102. III-Nitride layer 112 is then formed over graded transition body 108. Graded transition body 108 is typically formed of $Al_xGa_{(1-x)}N$, where the gallium content is varied from a relative lower concentration at first surface 107 to a relative higher concentration at second surface 109. Alternatively, the graded transition body 108 is typically graded from a relative small lattice parameter at first surface 107 to a relative larger lattice parameter at second surface 109. It is noted that although shown as a single layer in FIG. 1, graded transition body 108 may include one or more layers or interlayers. However the conventional approach depicted in FIG. 1 has not fully overcome the challenges associated with growing III-Nitride bodies on non-III-Nitride substrates, especially in the case of growing thick epitaxial layers (e.g., greater than 2-3 microns (2-3 µm)). Common practices used in the field typically employ grading of the III-Nitride composition or lattice parameters (graded in one direction only) of the transition layers and interlayers (e.g., from a high Al concentration to a low Al concentration, or from a low Ga concentration to a high Ga concentration, or from a small lattice parameter to a large lattice parameter). By using this type of grading scheme, the resulting strain on the composite structure tends to drive the deformation in one direction. However, this has had only limited success in managing deformation of thinner layers (typically less than 2 µm) as the grading schemes used do not counter the deformation during growth but only try to limit the magnitude of the deformation. As a result, in order not to exceed deformation limits, the allowable III-Nitride layer net thickness is limited. Therefore, there continues to be a need for solutions providing large diameter wafers capable of supporting thicker III-Nitride layers with little or no cracking, and with warp and bow levels within acceptable limits. Ideally, a solution is needed which would counter the deformation by employing different grading schemes during growth and allow for the deposition of III-Nitride structures with arbitrary thicknesses.

The present application is directed to semiconductor structures including one or more III-Nitride interlayer modules formed over a III-Nitride transition body scheme. The modular interlayer approach is adopted in order to reduce strain in the III-Nitride epi layers that can result from differences in thermal expansion rates between the III-Nitride material and a non-III-Nitride (e.g., silicon) substrate, as well as reducing strain in the epi layers and substrate associated with the lattice mismatch between each of the epi layers and the substrate, which can occur during epi layer formation at elevated growth temperatures. This reduction of strain can enable use of large diameter wafers capable of supporting thicker III-Nitride layers with little or no cracking, and with warp and bow levels within acceptable limits. It can also allow for the formation of thicker III-Nitride layers during III-Nitride epi layer growth without exceeding deformation limits at elevated growth temperatures. The initiation of each modular interlayer counters the deformation of the composite structure during growth and allows for continuation of growth without exceeding an approaching deformation limit. As a result, the modular interlayer approach can be used to scale the epi structure to an arbitrary thickness by repeating the formation of the module as many times as needed to achieve a desired total thickness, and enables formation of electronic devices which advantageously exhibit low leakage, low dynamic Rdson, high punch-through voltage (lateral breakdown voltage), and progressively higher vertical breakdown capability.

It is noted that although SiNx, GaN, AlN, and AlGaN materials will be specifically referenced in the present description, different materials can be used to provide the advantages described above. Furthermore, while four exemplary nitride based materials are described herein, e.g., SiNx, GaN, AlN and AlGaN, it will be appreciated that additional materials can be included in a semiconductor structure according to the present concepts.

Figure 2:
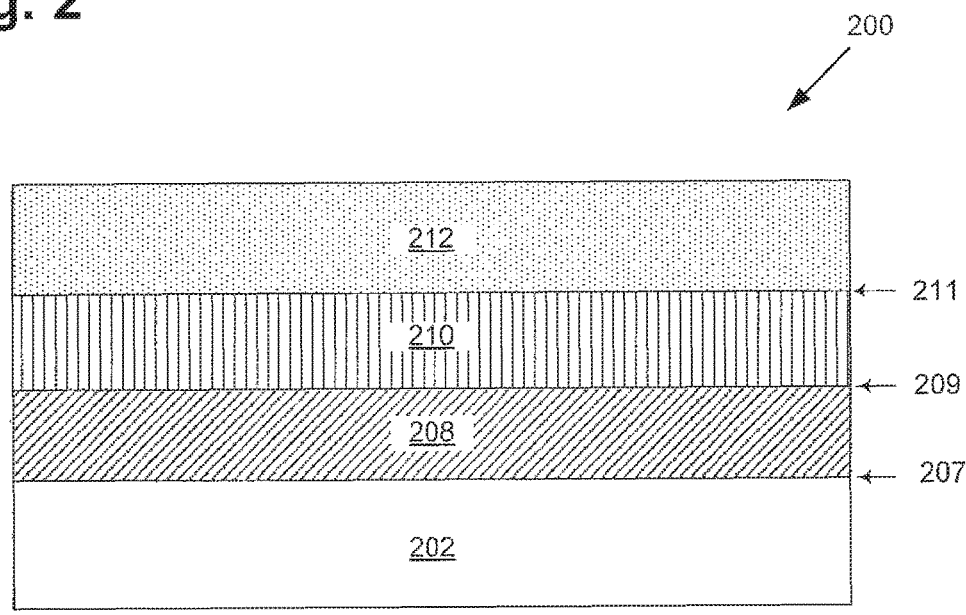
FIG. 2 shows a cross-sectional view of a semiconductor structure according to one implementation.

Referring to FIG. 2, a cross-sectional view of semiconductor structure 200 is shown, accord to one implementation of the present inventive principles. As shown in FIG. 2, semiconductor structure 200 includes substrate 202, which may be a non-III-Nitride substrate, first transition body 208, second transition body 210, and III-Nitride layer 212. Also depicted in FIG. 2 are first surface 207 and second surface 209 of first transition body 208, and upper surface 211 of second transition body 210.

Substrate 202 may be resistive or conductive, and may be formed using materials such as group IV materials (e.g., Si, SiC, Ge, SiGe, and the like), III-Nitride materials, sapphire, or other suitable material. Substrate 202 may be single crystal or polycrystalline, or may be formed as a composite substrate. Moreover, as used in the present application, "silicon substrate" refers to any substrate that includes a silicon surface. Examples of suitable silicon substrates include substrates that are formed substantially entirely of silicon (e.g., bulk silicon wafers), silicon-on-insulator (SOI) substrates, silicon-on-sapphire substrates (SOS), and SIMOX substrates, among others. Suitable silicon substrates also include composite substrates that have a silicon wafer bonded to another material such as diamond, AlN, or other polycrystalline materials.

In some implementations, silicon substrates having different crystallographic orientations may be used. In some cases, for example, silicon (111) substrates may be preferred for substrate 202. In other cases, silicon (100) or (110) substrates may be preferred for substrate 202. In certain other implementations, substrate 202 may be a silicon substrate having various device layers, homojunctions, heterojunctions or circuit layers embedded therein, or formed on the front-side or back-side of substrate 202. Substrate 202 may be a semi-spec standard thickness silicon substrate, or may be a thicker, or in some implementations a thinner than semi-spec standards substrate. In some implementations, substrate 202 may have a diameter of less than approximately one hundred millimeters (100 mm), for example. In other implementations, substrate 202 may have a diameter between approximately 100 mm and approximately 150 mm, and in other implementations, substrate 202 may have a diameter of approximately 150 mm to approximately 200 mm, or larger. In yet other implementations, substrate 202 may include a textured surface or may have a non-planer surface.

First transition body 208 may be a graded transition layer or a transition body including interlayers. In certain implementations, it may be desirable for first transition body 208 to have a low gallium concentration at first surface 207 and a higher gallium concentration at second surface 209. Alternatively, it may be desirable for first transition body 208 to have a smaller lattice parameter at first surface 207 and a larger lattice parameter at second surface 209. In one implementation, first transition body 208 may be formed of a single layer of AlGaN, for example. However, as will be described in greater detail below, in certain other implementations, first transition body 208 may include a plurality of interlayers. Second transition body 210 is situated over first transition body 208 and may be formed of a graded III-Nitride transition module with more than one interlayer, for example, as will also be described in greater detail below. III-Nitride layer 212 may be implemented as buffer layer, for example, and may be formed of an suitable III-Nitride material, such as GaN or AlGaN, for instance.

Figure 3A:
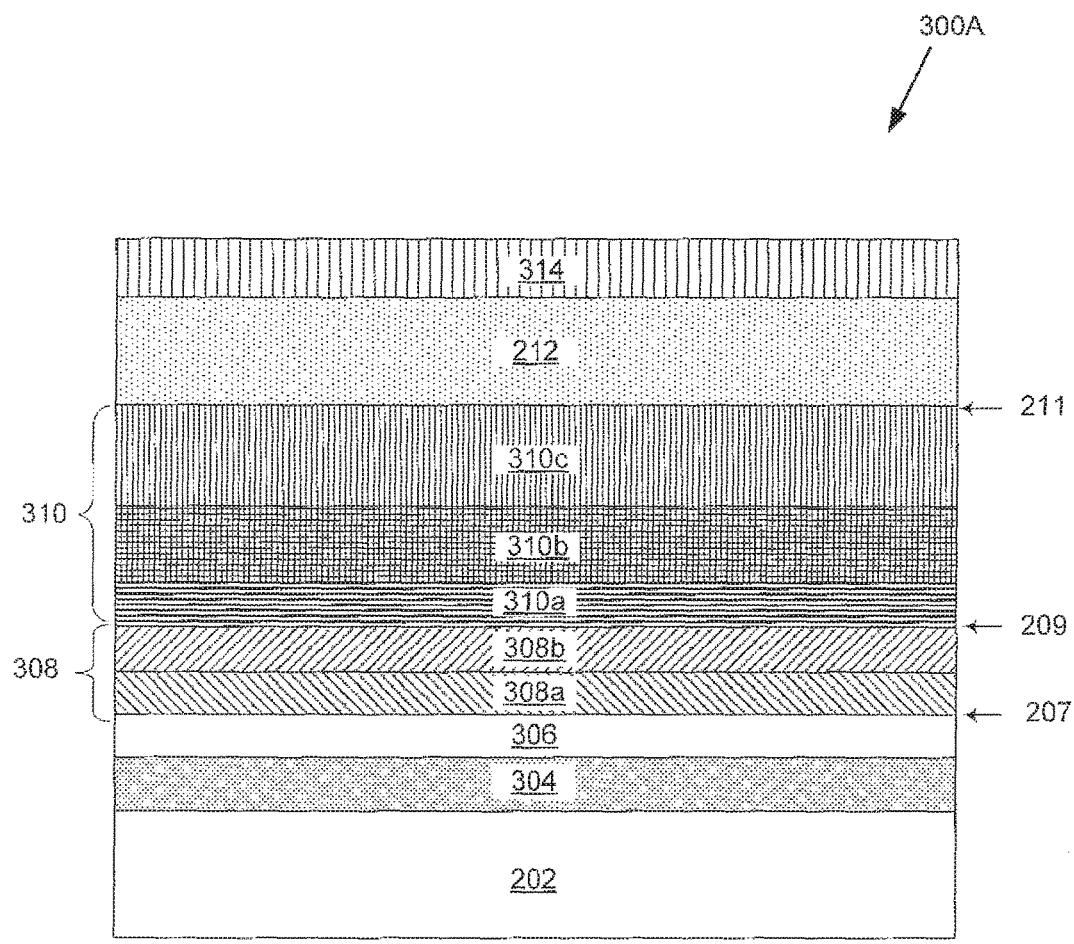
FIG. 3A shows a cross-sectional view of a semiconductor structure according to another implementation.

Referring now to FIG. 3A, a cross-sectional view of semiconductor structure 300A is shown, according to another implementation. As shown in FIG. 3A, semiconductor structure 300A includes substrate 202, layer 304, intermediate body 306, first transition body 308, second transition body 310, III-Nitride buffer layer 212, and device layer 314. As further shown in FIG. 3A, according to the example implementation of semiconductor structure 300A, first transition body 308 may be a graded transition body including interlayers 308a and 308b, and second transition body 310 may be a transition module formed as interlayers 310a, 310b, and 310c. First transition body 308 and second transition body 310 correspond respectively to first transition body 208 and second transition body 210, in FIG. 2, and may share any of the characteristics attributed to those corresponding features above. Also depicted in FIG. 3A are first surface 207 and second surface 209 of first transition body 308, and upper surface 211 of second transition body 310.

As shown in FIG. 3A, layer 304 can be formed over substrate 202. It is noted that when a layer is referred to as being "on", "over" or "overlying" another layer, body, or substrate, it can be directly on the layer, body, or substrate, or an intervening layer or layers may also be present. A layer that is "directly on" another layer, body, or substrate means that no intervening layer is present. It is further noted that when a layer is referred to as being "on", "over" or "overlying" another layer, body, or substrate, it may cover the entire layer, body, or substrate, or a portion of the layer, body, or substrate.

In some implementations, layer 304, is formed over substrate 202, and may be a strain absorbing layer, such as a silicon nitride based strain absorbing layer, for example. When implemented as a strain absorbing layer, layer 304 may help to absorb strain that arises due to lattice mismatch between the crystal structure of substrate 202 and the crystal structure of intermediate body 306. In the absence of strain-absorbing layer 304, for example, this lattice mismatch induced strain is typically accommodated by the generation of misfit dislocations in intermediate body 306 at its interface with substrate 202. Thus, by providing an alternative mechanism for accommodating strain, the presence of layer 304 may reduce the generation of misfit dislocations. Moreover, when implemented as a strain-absorbing layer, layer 304 can help absorb strain that arises due to differences in the thermal expansion rate of substrate 202 as compared to the thermal expansion rate of intermediate body 306 and/or the overlying material stack including first transition body 308, second transition body 310, III-Nitride buffer layer 212, and device layer 314.

In some implementations, layer 304 may be formed of a silicon nitride based material. As used herein, the phrase "silicon nitride based material" refers to a compound that includes silicon and at least nitrogen. A silicon nitride based material may take on the specific stoichiometric form of $Si_3N_4$ or of any number of stoichiometric forms described as $Si_xN_y$, or may be the non-stoichiometric form generally described as $SiN_x$.

It is noted that in certain other implementations, such as when a III-Nitride substrate is used as substrate 202, it may not be desirable to form layer 304.

As shown in FIG. 3A, intermediate body 306 may be formed over layer 304. In certain implementations, intermediate body 306 may be a III-Nitride layer. In certain implementations, intermediate body 306 is used as a nucleation layer for subsequent growth of overlying III-Nitride layers or bodies. It may be preferred that intermediate body 306 be substantially an AlN layer, for example. Use of an AlN layer as intermediate body 306 may be advantageous for establishing a stable hexagonal or wurtzitic crystal polytype upon which to deposit overlying hexagonal or wurtzitic III-Nitride materials and device structures. In other implementations, an AlN intermediate layer may be preferred for intermediate body 306, so as provide a dielectric or electrically insulating layer from substrate 202, which may be beneficial for the isolation and integration of III-Nitride based devices and silicon based devices on a common substrate. It is noted that in some implementations, intermediate body 306 may be formed of two or more layers.

As further shown in FIG. 3A, first transition body 308 away be formed over intermediate body 306. In some implementations, first transition body 308 is a first III-Nitride graded transition body including two or more interlayers. In certain implementations, it may be desirable for first transition body 308 to have a lower gallium concentration at first surface 207 and a higher gallium concentration at second surface 209. Alternatively, it may be desirable for first transition body 308 to have a smaller lattice parameter at first surface 207 and a larger lattice parameter at second surface 209. In one implementation, first transition body 308 may be formed of a single layer of AlGaN, for example. However, as shown by semiconductor structure 300A, in certain other implementations, first transition body 308 may include a plurality of interlayers, such as interlayer 308a and interlayer 308b. It may be advantageous for interlayer 308a to have a smaller lattice parameter than interlayer 308b. Moreover, it may be advantageous for interlayer 308a to have a higher aluminum concentration than interlayer 308b. For example, it may be desirable for interlayer 308a to be formed of $Al_xGa_{(1-x)}N$, where x>30%. It may also be desirable for interlayer 308b to be formed of $Al_yGa_{(1-y)}N$, where y<30%. Interlayers 308a and 308b may be of constant composition, or may each be graded in composition.

In certain other implementations, it may be desirable for first transition body 308 to have a high gallium concentration at first surface 207 and a low gallium concentration at second surface 209. Alternatively, it may be desirable for first transition body 308 to have a larger lattice parameter at first surface 207 and a smaller lattice parameter at second surface 209. In other implementations, first transition body 308 may include additional interlayers, such as through repetition of interlayers 308a and/or 308b, through including additional interlayers with different compositions than interlayers 308a or 308b, including interlayers with different grading schemes than those of interlayers 308a or 308b, or including interlayers having the same composition, lattice parameter, or grading schemes but which may additionally include an impurity or dopant within one, some, or all of the interlayers.

Referring now to second transition body 310, second transition body 310 may be formed over first transition body 308. In some implementations, second transition body 310 may be a III-Nitride body forming a single layer. Alternatively, second transition body 310 may be formed as a transition module including two or more interlayers, such as III-Nitride interlayers, for example, as shown in FIG. 3A. In certain implementations, it may be desirable for second transition body 310 to have a low gallium concentration or smaller lattice parameter at a lower surface overlying second surface 209 of first transition body 308, and a high gallium concentration or larger lattice parameter at upper surface 211. Second transition body 310 may be formed of $Al_xGa_{(1-x)}N$, for example, and have a higher aluminum concentration at the lower surface overlying second surface 209 of first transition body 308, and a lower aluminum concentration at upper surface 211. Alternatively, second transition body 310 may be formed of $Al_xIn_yGa_{(1-x-y)}N$, for example, and have a smaller lattice constant at the lower surface overlying second surface 209 of first transition body 308, and a larger lattice constant at upper surface 211. In certain other implementations, second transition body 310 may be formed of a graded transition, and thus may be a graded III-Nitride transition body, for example, or may include superlattice structures.

In implementations in which second transition body 310 includes multiple interlayers or superlattice structures, it may be advantageous for second transition body 310 to be formed of three $Al_xGa_{(1-x)}N$ interlayers, as shown by interlayers 310a, 310b and 310c. It may also be advantageous for interlayer 310a to have a high aluminum content. In addition, or alternatively, it may also be advantageous that interlayer 310a have substantially no gallium content or be formed substantially entirely of AlN. It may also be desirable for the thickness of interlayer 310a to be thinner than layers 310b and 310c. In certain implementations, it may be advantageous for the thickness of interlayer 310a to be thinner than that of layer 310b, which may be thinner than interlayer 310c. It may also be advantageous for interlayer 310a to be less than 10 nanometers (10 nm) thick, and in some cases less than 5 nm thick.

It may also be advantageous for second transition body 310 to be formed of three $Al_xIn_yGa_{(1-x-y)}N$ interlayers. As such, it may be advantageous for interlayer 310a to have a smaller lattice constant than the lattice constant of interlayers 310b and 310c. In certain implementations, it may be advantageous for the lattice parameter of interlayer 310a to be smaller than the lattice parameter of interlayer 310b, may be smaller than the lattice parameter of interlayer 310c.

According to the present implementation, interlayer 310b is formed over interlayer 310a and may be formed of AlGaN. For example, interlayer 310b may be formed of $Al_zGa_{(1-z)}N$, where 0.90>z>0.25. However, in other implementations, the value "z" may be approximately 0.35 (e.g., z~0.35).

Interlayer 310c may be formed over interlayers 310a and 310b, and may be formed of AlGaN. In certain implementations, for example, interlayer 310c may be formed directly on interlayer 310b or directly on interlayer 310a. In other implementations, interlayer 310c has a lower concentration of aluminum and is formed of $Al_wGa_{(1-w)}N$, where 0.25≥w>0.04. However, in other implementations, the value "w" may be approximately 0.06 (e.g., w~0.06).

In some implementations, one or more of interlayers 310a, 310b and 310c may each be of a constant composition, be graded in composition. In some other implementations, the III-Nitride alloy composition of two or more superlattice interlayers may be the same, but they may be differentiated by containing different dopants or impurities, or be formed using different deposition conditions (e.g., temperature, pressure, nitrogen or hydrogen atmospheres).

The specific details of the compositions, grading, and thickness of first and second transition bodies 308 and 310 may depend on the selection of substrate 202, or example, as well as on the characteristics of III-Nitride buffer layer 212 and device layer 314 formed over first and second transition bodies 308 and 310. Substrate considerations may include, for example, surface finish, thickness and wafer diameter. Buffer and device layer considerations may include, for example, III-Nitride buffer layer 212 composition and thickness, as well as the composition and thickness of the active or channel layer, spacer layers, barrier layers and any additional device layers all referred collectively in FIG. 3A as device layer 314. Additional considerations include breakdown voltage, dynamic Rdson, current collapse or other transient phenomena related to field induced charge state changes (causing temporal variation in the electron density of the 2DEG) and leakage properties of devices fabricated in device layer 314, as well as the total thickness of the III-Nitride material stack, and any wafer crack, bow, warp, or deformation constraints. For example, for low or medium voltage power FETs, which may be defined respectively as having breakdown voltage (Vbd)<50V, and 50V<Vbd<300V, the total thickness of the III-Nitride material stack formed over a 150 mm diameter, 625-675 µm thick silicon substrate may be approximately 2-3 µm, may require a wafer bow of less than approximately 10-30 µm, and may require a wafer warp of less than approximately 20-60 µm, to allow for device fabrication.

Figure 3B:
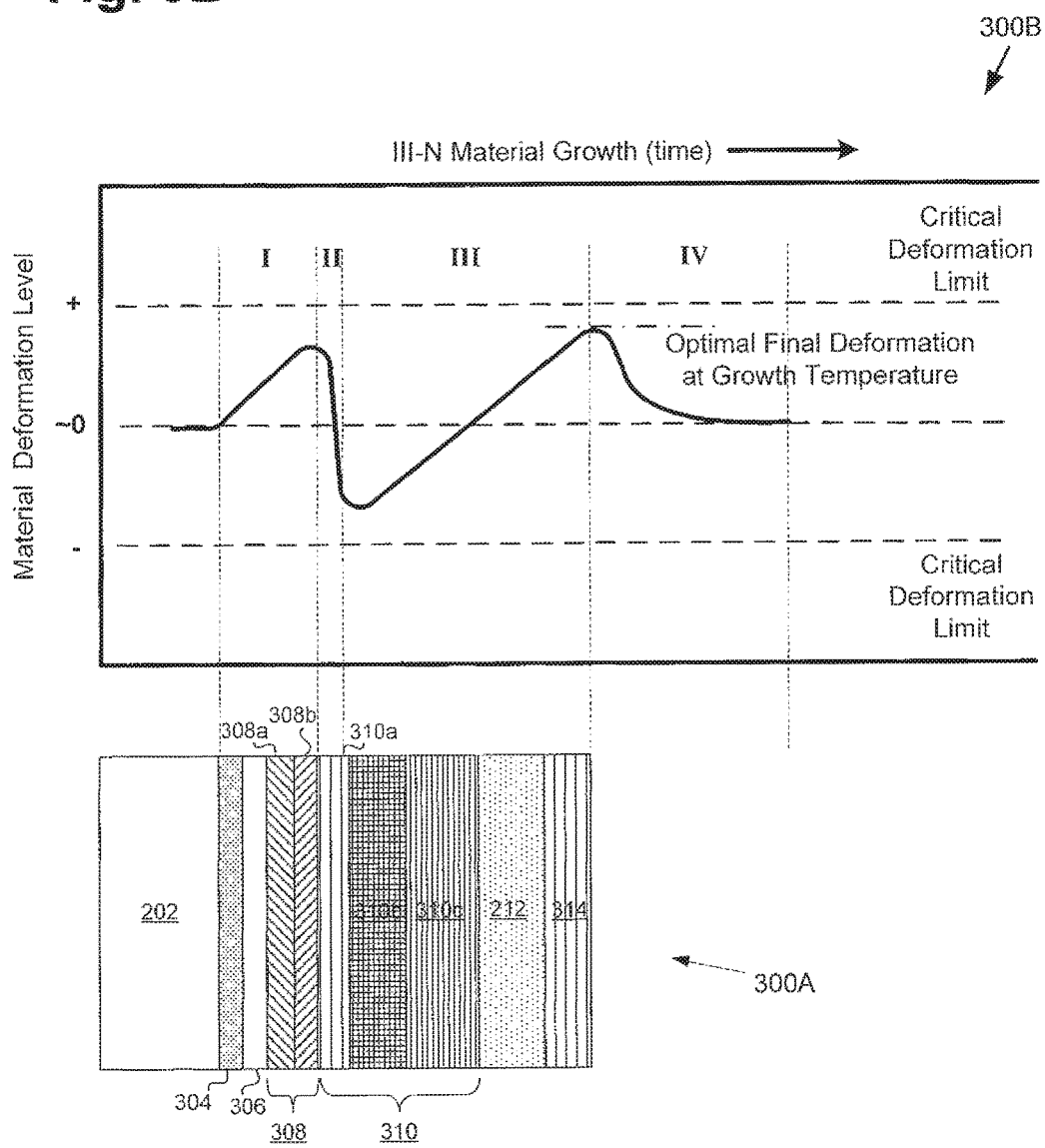
FIG. 3B shows a schematic of a potential plot of deformation of a semiconductor structure corresponding generally to the implementation shown in FIG. 3A.

Referring to FIG. 3B, a schematic of semiconductor structure 300A is shown superimposed below a corresponding schematic of potential plot 300B of the deformation of the composite structure at various times during the formation of semiconductor structure 300A. Actual measurement of the deformation may vary greatly in both feature and relative magnitude and FIG. 3B is meant only to guide the current discussion. The deformation may be associated with allowable warp or bow of the composite structure while the structure is at elevated temperature, and are typically caused by lattice constant difference and thicknesses of the various interlayers, transition bodies and substrate. At elevated temperature during growth, if the deformation limit is exceeded, the structure may warp or bow and result in loss of uniformity of temperature across the structure. This in turn may lead to non-uniformities in both the continued deposition of uniform layer thickness and or uniform layer alloy composition, both capable of adversely affecting device performance and device fabrication yield. In extreme cases, the structure may macroscopically deform so severely that the epi layers may crack, the substrate and or epi layers may plastically deform (e.g., crystal slip may occur), the wafer may break or may move out of position in the crystal growth chamber.

In other examples, the deformation targets may refer to predetermined levels of deformation which may not be detrimental at the elevated growth temperatures, but may lead to detrimental deformation upon cooling from the elevated temperatures required for epitaxy down to room temperature, after formation of the structure, and are caused by the differences in thermal coefficients of expansion. In the ideal case, the growth is terminated with some level of deformation at high temperature, but upon cooling, the entire structure relaxes to a lower deformation level or near stress free state at room temperature.

Again referring to FIG. 3B, in region I of potential plot 300B, as layer 304, intermediate body 306, and first transition body 308 are formed, they add stress to the composite structure which results in the deformation of the composite structure. As growth continues, the deformation will approach the critical deformation limit and if the growth were allowed to continue unabated, the structure would eventually exceed a critical deformation limit and result in excessive warp, bow, slip, or even cracking of the structure. To prevent exceeding the critical deformation limit, second transition body 310 is initiated in region II, subjecting the structure to an opposing stress state. In the current example, interlayer 310a counters the stress state, however not so much that it may also cause exceeding a deformation limit at the other extreme. Once the stress state is adequately modified, interlayers 310b and 310c are formed within region III, as are buffer layer 212 and device layer 314. The formation of semiconductor structure 300A can then be terminated at substantially the optimal final deformation state without exceeding the critical deformation limit, and semiconductor structure 300A is cooled down to room temperature in region IV. Upon cooling, the final deformation determined by the resultant sum of the stresses due to mismatches in thermal expansion of the substrate and the final "as grown" composite structure is substantially minimized.

In implementations in which a thicker III-Nitride material stack is desired, or perhaps a breakdown voltage of approximately 300V or greater is needed, it may be advantageous to form a structure which includes second transition body 310 formed from a series of repeated interlayers or additional transition modules, as shown and described in greater detail below by reference to FIG. 4A. In other implementations, second transition body 310 may include additional interlayers having compositions other than those characterizing interlayers 310a, 310b or 310c. That is to say, in addition to interlayers 310a, 310b, and 310c, second transition body 310 may include more interlayers with different grading schemes than those used to implement interlayers 310a, 310b or 310c. Alternatively, in addition to interlayers 310a, 310b, and 310c, second transition body 310 may include other interlayers having substantially the same composition, lattice parameter or grading schemes as interlayers 310a, 310b, and 310c, but may include an impurity or dopant within the additional interlayers, or have the same compositions but be deposited under different growth conditions, for example.

Referring back to FIG. 3A, III-Nitride buffer layer 212 may be formed over first and second transition bodies 308 and 310. III-Nitride buffer layer 212 may be a GaN or AlGaN buffer layer, for example. In some implementations, III-Nitride buffer layer 212 is formed of $Al_yGa_{(1-y)}N$, where $v \le 0.10$ or $\le 0.08$. In some implementations, III-Nitride buffer layer 212 may be intentionally doped, unintentionally doped, or undoped. In certain other implementations, III-Nitride buffer layer 212 may be undoped and exhibit a low carbon concentration of less than approximately $5E17/cm^3$. In certain other implementations, III-Nitride buffer layer 212 may exhibit a graded impurity concentration. Second transition body 310 enables formation of III-Nitride buffer layer 212 to thicknesses with acceptable levels of deformation exceeding thicknesses that would be achievable without the addition of second transition body 310 in composite semiconductor structure 300A. In some implementations, III-Nitride buffer layer 212 may be more than approximately 1 µm thick, in other implementations, III-Nitride buffer layer 212 may be only approximately 0.5 µm to approximately 1.0 µm thick, while in yet other implementations III-Nitride buffer layer 212 may be approximately 0.1 µm to approximately 0.5 µm thick. In addition, it is noted that III-Nitride buffer layer 212 may include a plurality of interlayers.

Referring now to device layer 314, device layer 314 may be a III-Nitride device layer formed over III-Nitride buffer layer 212, as shown in FIG. 3A. In some implementations, device layer 314 may be formed of several device interlayers necessary to form, for example, a fabricated device such as a diode, FET, or HEMT (device interlayers not shown in FIG. 3A). Other possible fabricated devices include opto-electronics devices such as light emitting diodes (LEDs), lasers and detectors/sensors. In addition, or alternatively, device layer 314 may include device structures involving single or multilayer spacers, capping, channel, and barrier layers, for example.

Figure 4A:
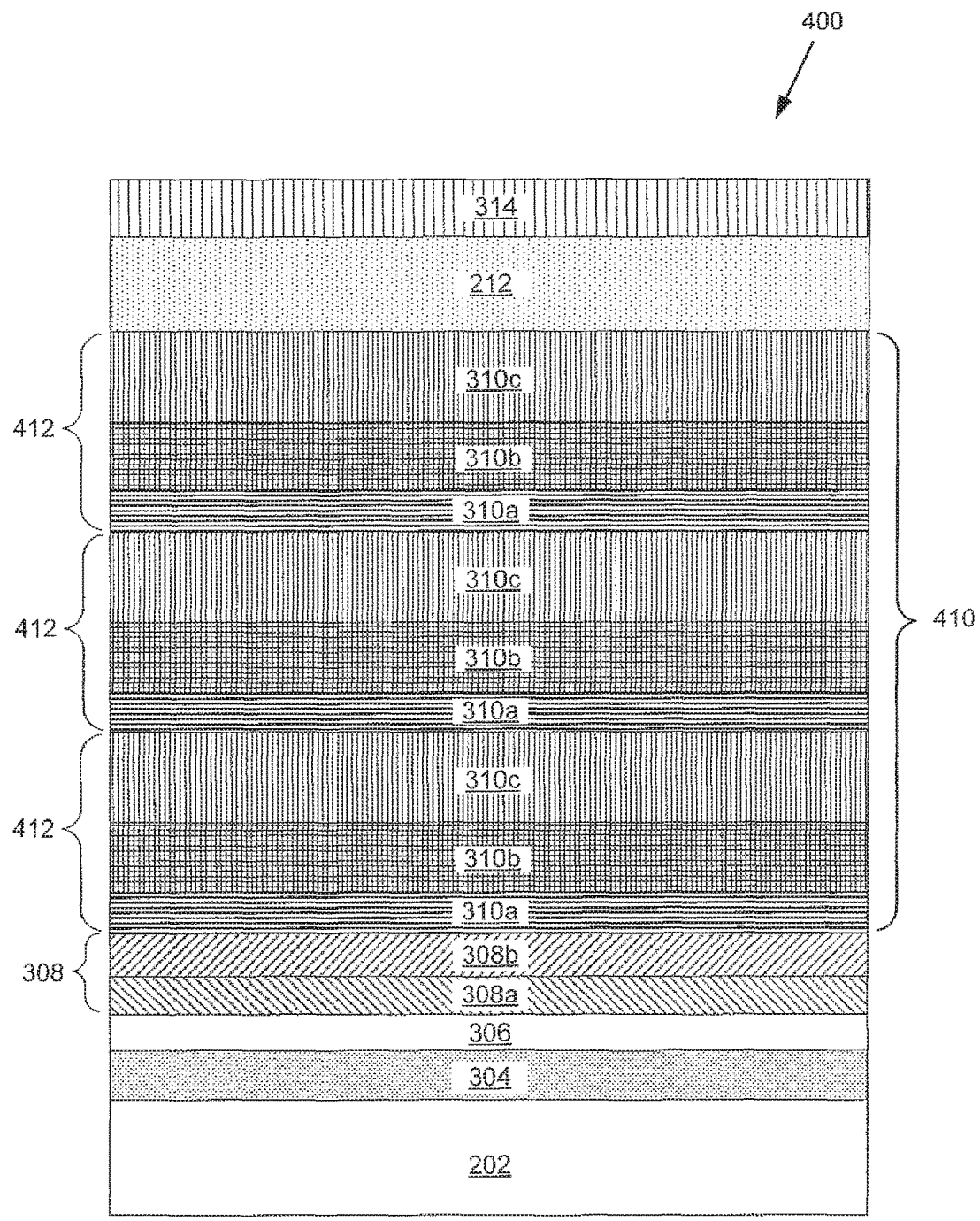
FIG. 4A shows a cross-sectional view of a semiconductor structure according to another implementation.

Referring to FIG. 4A, a cross-sectional view of semiconductor structure 400A is shown according to another implementation. In some situations, it may be advantageous to develop a III-Nitride stack which is thicker than 2-3 μm, or to form devices having a breakdown voltage greater than 300V, for example. In such situations, semiconductor structure 400A may prove advantageous. According to the implementation shown by semiconductor structure 400A, modified second transition body 410 replaces second transition body 310, in FIGS. 3A and 3B. As shown in FIG. 4A, second transition body 410 may include first transition module 412, repeated three times. In one implementation, each transition module 412 may include three interlayers 310a, 310b and 310c. Interlayers 310a, 310b and 310c may be formed of $Al_xIn_yGa_{(1-x-y)}N$ and may be substantially the same as the corresponding interlayers described by reference to FIG. 3A. However, according to the present implementation, multiple transition modules 412 are formed in order to accommodate the added strain that a thicker III-Nitride epi structure or larger diameter non-III-Nitride substrate may require, for example by modifying the deformation of the composite structure with the initiation of each transition module 412. Alternatively, the use of additional transition modules may allow for thicker epi structures with the initiation of each transition module 412 subjecting the structure to an opposing stress state. As interlayer 310c is grown, additional stress is added that can once again cause the composite structure to approach a critical deformation limit. The thickness of each of transition modules 412 and their constituent interlayers (310a, 310b and 310c) is governed by the lattice parameter of the interlayers and the resulting stress added to the composite structure due to the mismatch in lattice parameters of the constituent layers. In the current example, interlayer 310a acts to counter the net stress state, however not so much that it may also cause a deformation limit at the other extreme to be exceeded. It is noted that although FIG. 4A shows three transition modules 412, in other implementations, more, or less than three transition modules 412 may be utilized. It is further noted that in one implementation, one or more additional interlayers may be formed between transition modules 412.

Figure 4B:
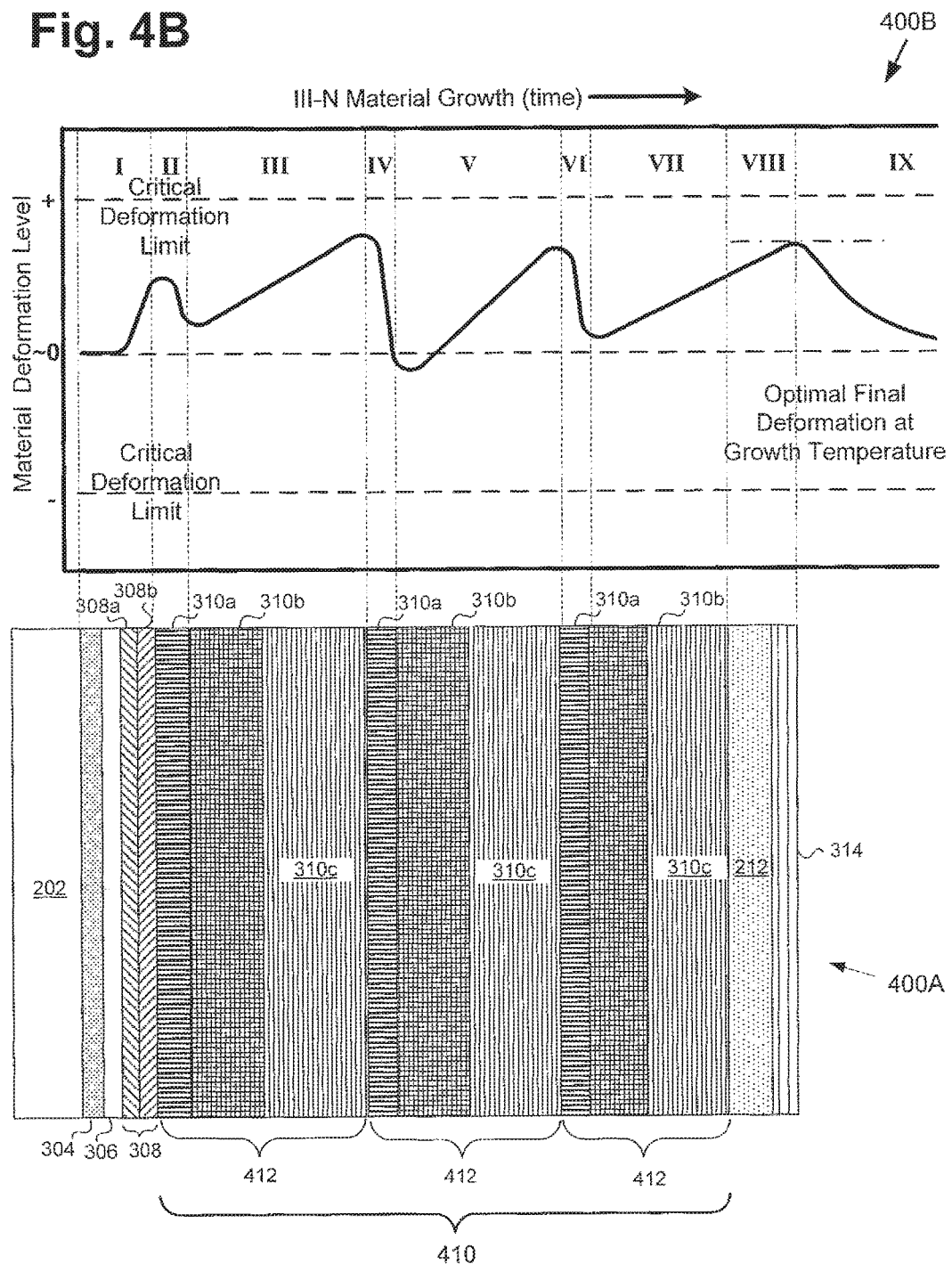
FIG. 4B shows a cross schematic of a potential plot of deformation of a semiconductor structure corresponding generally to the implementation shown in FIG. 4A.

Referring to FIG. 4B, a schematic of semiconductor structure 400A is shown superimposed below a schematic of potential plot 400B of the deformation of the composite structure at various times during the formation of semiconductor structure 400A. Actual measurement of the deformation may vary greatly in both feature and relative magnitude and FIG. 4B is meant only to guide the current discussion. As in FIG. 3B, the deformation may be associated with the interlayer lattice constant differences and thicknesses of the various interlayers, transition layers and substrate and/or may be associated with the differences in thermal coefficients of expansion, particularly in the cooling from high temperatures.

In region I of potential plot 400B, as layer 304, intermediate body 306 and first transition body 308 are formed, they add stress to be composite structure, which results in the deformation of the composite structure. As growth continues, the deformation approaches a critical deformation limit. To prevent exceeding this critical deformation limit, second transition body 410 is initiated in region II starting with first transition module 412, subjecting the composite structure to an opposing stress state. In the current example, interlayer 310a of transition module 412 counters the stress state, however not so much that it may also cause exceeding a deformation limit at the other extreme. Once the stress state is adequately modified, interlayers 310b and 310c are formed within region III. Again as interlayer 310c is grown, a deformation limit is approached. However, in this example a thicker composite structure is desired to attain the required device performance levels than the use of one transition module 412 will allow, without exceeding a deformation limit. As such, to once again prevent exceeding a deformation limit during growth, the first transition module 412 is terminated and a second transition module 412 is initiated in region IV. Similar to the first transition module 412, interlayer 310a of the second transition module 412 again counters the stress state. Once the stress state is adequately modified, interlayers 310b and 310c are formed within region V, completing the formation of the second transition module 412.

A third transition module 412 may then be formed in regions VI and VII (or if thicker III-Nitride material is required, a forth, fifth, and so forth, transition modules may be formed) similar to first and second transition modules 412, to achieve the desired total epitaxial thickness, completing the formation of the second transition body 410. Finally, in Region VIII, buffer layer 212 and device layer 314 are formed and growth of composite semiconductor structure 400A is then terminated, once again without exceeding a critical deformation limit. Semiconductor structure 400A is then cooled down to room temperature in region IX. Upon cooling, the final deformation which occurs due to mismatches in thermal expansion of the wafer is substantially minimized due to termination of the growth near the substantially optimal final "as grown" deformation condition achieved in region VIII.

Figure 5:
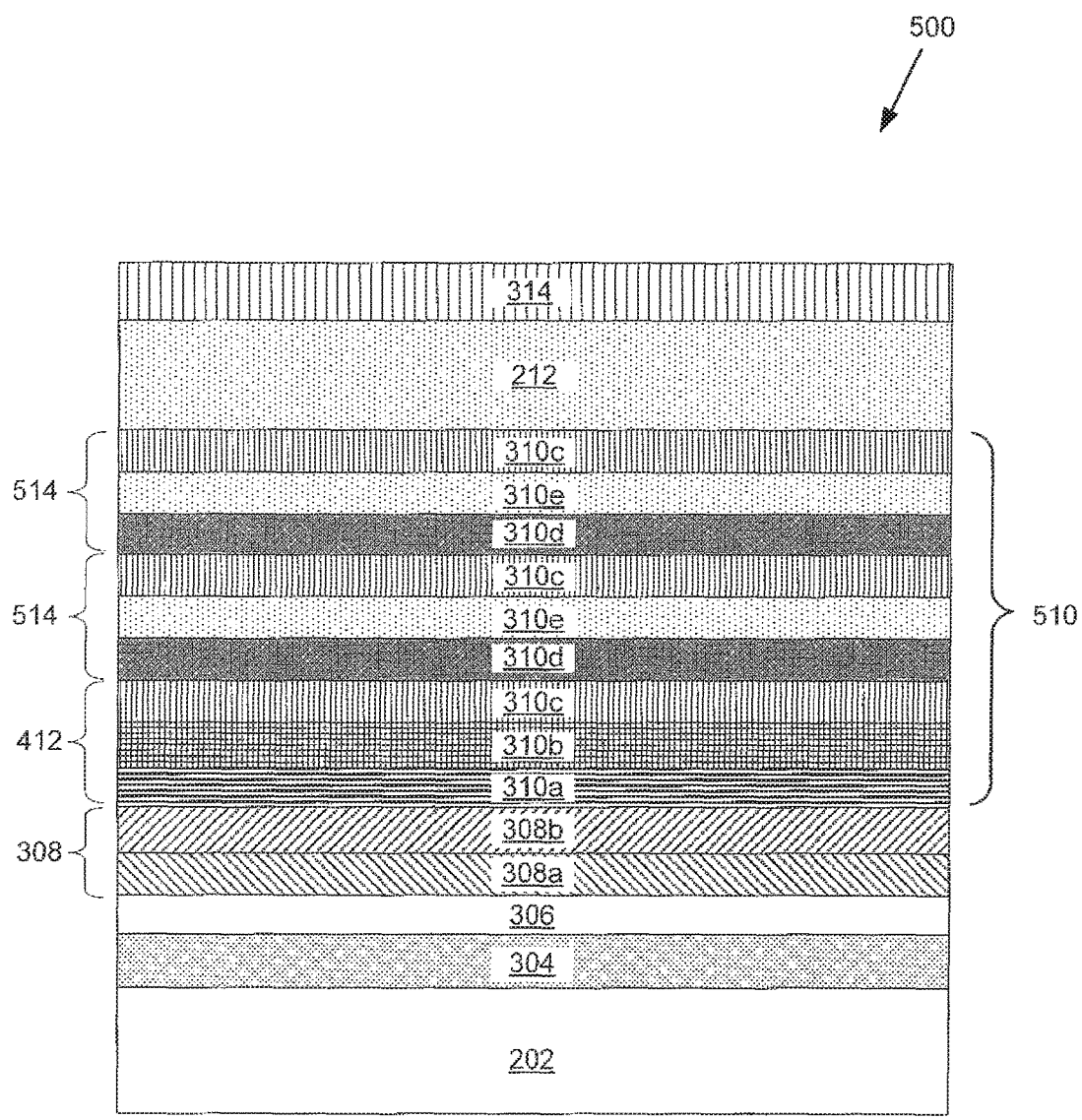
FIG. 5 shows a cross-sectional view of a semiconductor structure according to yet another implementation.

Alternatively, and as shown by semiconductor structure 500, in FIG. 5, another exemplary implementation may modify second transition body 410, in FIG. 4A, through substitution of transition modules 514 for some of transition modules 412. As shown in FIG. 5, according to one such implementation, second transition body 510 includes transition module 412, and transition module 514 formed of interlayers 310d, 310e, and 310c, repeated twice. In certain implementations, transition module 514 may be formed over transition module 412, as depicted in FIG. 5. In other implementations, transition module 412 may be formed between two transition modules 514. It is noted that although interlayers 310a, 310b, and 310c are depicted as having similar thicknesses in FIG. 5, that representation has been adopted merely to simplify the description of semiconductor structure 500. In other implementations, interlayers 310a, 310b, and 310c can have the differing thicknesses discussed in greater detail above.

According to the present implementation, interlayers 310a, 310b, and 310c forming transition module 412 have one interlayer common with the interlayers forming transition module 514 (e.g., interlayer 310c). However, in other implementations, transition modules 412 and 514 may have several interlayers in common, or may have none in common. In some other implementations, the interlayer compositions of transition modules 412 and 514 may be substantially the same, but their respective thicknesses or deposition conditions may be different. Although only a limited number of possible variations are presented as example implementations in the interest of clarity, it is to be understood that second transition body 510 can be adapted in a number of ways consistent with the present concepts. For example, one alternative implementation may utilize two or more transition modules, with each transition module having a different number of interlayers, and/or wherein each interlayer differs in composition from every other interlayer included in second transition body 510.

Figure 6:
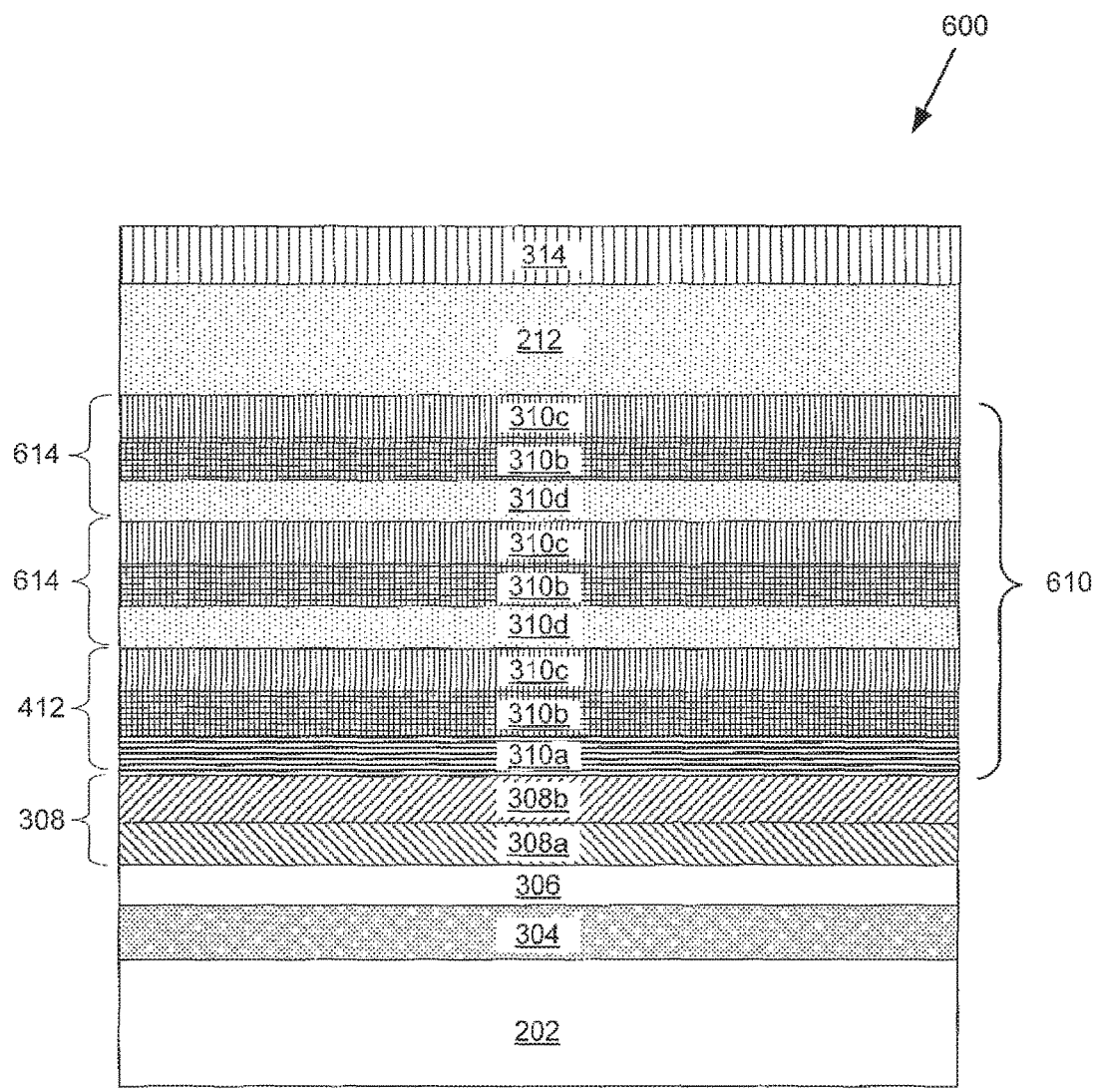
FIG. 6 shows a cross-sectional view of a semiconductor structure according to another implementation.

Referring to FIG. 6, semiconductor structure 600 presents one additional example implementation semiconductor structure according to the present concepts. According to the implementation shown in FIG. 6, second transition body 510, in FIG. 5, is replaced by second transition body 610. As shown by semiconductor structure 600, second transition body 610 may form a multi-interlayer or superlattice region including transition module 412 and transition module 614 repeated twice. Transition module 412 may include three interlayers, for example, interlayer 310c formed over interlayer 310b formed over interlayer 310a, as shown in FIG. 6. Moreover, according to the present implementation, transition module 614 may include three interlayers, for example, interlayer 310c formed over interlayer 310b formed over interlayer 310d. In certain implementations, interlayers 310a and 310d may both be AlN interlayers, for example, with AlN interlayer 310a being formed thinner or thicker and at a lower or higher temperature than AlN interlayer 310d.

Thus, the semiconductor structures disclosed herein are configured to reduce strain and subsequent macroscopic deformation associated with the differences in lattice parameters and thermal expansion coefficients of the constituent layers within the composite semiconductor structure. As a result, the disclosed semiconductor structures can advantageously enable use of large diameter wafers capable of supporting thicker III-Nitride layers with little or no cracking, with minimal plastic deformation or dislocation propagation, and with resultant warp and bow levels within acceptable limits. Consequently, the semiconductor structures disclosed herein can be used to enable formation of devices exhibiting low leakage, low dynamic Rdson, high punch-through voltage, and high vertical breakdown capability.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor structure, comprising:
a substrate;
a first graded transition body over the substrate, the first graded transition body having a first lattice parameter at a first surface and a second lattice parameter at a second surface opposite the first surface;
a second transition body having a smaller lattice parameter at a lower surface overlying the second surface of the first graded transition body and a larger lattice parameter at an upper surface of the second transition body, the second transition body including at least two transition modules each having at least three interlayers; and
a III-Nitride semiconductor layer over the second transition body,
wherein the first graded transition body and the second transition body reduce strain for the semiconductor structure,
wherein the first graded transition body and the second transition body are each Nitride-based transition bodies.

2. The semiconductor structure of claim 1, wherein the at least two transition modules are substantially the same.

3. The semiconductor structure of claim 1, wherein the at least two transition modules have at least one of the at least three interlayers in common.

4. The semiconductor structure of claim 1, wherein the at least two transition modules are different.

5. The semiconductor structure of claim 1, wherein the substrate is a non-III-Nitride substrate.

6. The semiconductor structure of claim 1, wherein the III-Nitride semiconductor layer comprises a fabricated device.

7. The semiconductor structure of claim 6, wherein the fabricated device is a high electron mobility transistor (HEMT).

8. The semiconductor structure of claim 1, wherein the substrate is a group IV substrate.

9. The semiconductor structure of claim 1, wherein the substrate is a silicon substrate.

10. The semiconductor structure of claim 1, further comprising a strain absorbing layer between the substrate and the first graded transition body.

11. The semiconductor structure of claim 10, further comprising an intermediate layer comprising AlN formed between the strain absorbing layer and the first graded transition body.

12. The semiconductor structure of claim 1, wherein the second transition body is formed directly on the second surface of the first graded transition body.

13. The semiconductor structure of claim 1, wherein the at least three interlayers of the at least two transition modules of the second transition body each comprise $Al_x In_y Ga_{(1-x-y)} N$.

14. The semiconductor structure of claim 1, wherein the at least two transition modules of the second transition body have a different number of interlayers.

15. A semiconductor structure, comprising:
a substrate;
a first graded transition body over the substrate, the first graded transition body having a first lattice parameter at a first surface and a second lattice parameter at a second surface opposite the first surface;
a second transition body having a smaller lattice parameter at a lower surface overlying the second surface of the first graded transition body and a larger lattice parameter at an upper surface of the second transition body, the second transition body including at least two transition modules each having at least three interlayers; and
a III-Nitride semiconductor layer over the second transition body,
wherein the first graded transition body and the second transition body reduce strain for the semiconductor structure,
wherein the first graded transition body is a III-Nitride graded transition body comprising two or more interlayers.

16. A semiconductor structure, comprising:
a substrate;
a first graded transition body over the substrate, the first graded transition body having a first lattice parameter at a first surface and a second lattice parameter at a second surface opposite the first surface;
a second transition body having a smaller lattice parameter at a lower surface overlying the second surface of the first graded transition body and a larger lattice parameter at an upper surface of the second transition body, the second transition body including at least two transition modules each having at least three interlayers; and
a III-Nitride semiconductor layer over the second transition body,
wherein the first graded transition body and the second transition body reduce strain for the semiconductor structure,
wherein the first graded transition body is formed of a single layer of AlGaN.

17. A semiconductor structure, comprising:
a substrate;
a first graded transition body over the substrate, the first graded transition body having a first lattice parameter at a first surface and a second lattice parameter at a second surface opposite the first surface;
a second transition body having a smaller lattice parameter at a lower surface overlying the second surface of the first graded transition body and a larger lattice parameter at an upper surface of the second transition body, the second transition body including at least two transition modules each having at least three interlayers; and
a III-Nitride semiconductor layer over the second transition body,
wherein the first graded transition body and the second transition body reduce strain for the semiconductor structure,
wherein the first graded transition body comprises a first interlayer and a second interlayer formed on the first interlayer,
wherein the first interlayer of the first graded transition body has a smaller lattice parameter than the second interlayer of the first graded transition body,
wherein the first interlayer of the first graded transition body has a higher aluminum concentration than the second interlayer of the first graded transition body.

* * * * *